United States Patent [19]

Grace et al.

[11] Patent Number: 5,191,294

[45] Date of Patent: Mar. 2, 1993

[54] MEASURING NOISE FIGURE AND Y-FACTOR

[75] Inventors: Martin I. Grace, San Jose; Donald A. Bradley, Morgan Hill; James N. Liu, San Jose, all of Calif.

[73] Assignee: Wiltron Company, Morgan Hill, Calif.

[21] Appl. No.: 917,909

[22] Filed: Jul. 21, 1992

Related U.S. Application Data

[63] Continuation of Ser. No. 502,825, Apr. 2, 1990, abandoned.

[51] Int. Cl.$^5$ ............................................. G01R 27/06
[52] U.S. Cl. ...................................... 324/613; 324/638
[58] Field of Search .............................. 324/612-614, 324/624, 638

[56] References Cited

U.S. PATENT DOCUMENTS

| | | | |
|---|---|---|---|
| 4,858,160 | 8/1989 | Strid et al. | 324/638 X |
| 4,905,308 | 2/1990 | Davidson | 324/613 X |
| 4,998,071 | 3/1991 | Strid et al. | 324/613 |

OTHER PUBLICATIONS

Cascade Microtech, "On-Wafer Noise and S-Parameter Measurement", Model NPT18 Noise Test Set, Sales Brochure Nov. 1988.

Leake et al., Use Network Data to Hone On-Wafer Noise Parameters, Microwaves & RF Feb. 1989, pp. 99-105.

Automatic Testing and Networking, Inc., On-Wafer Noise Parameter and S-Parameter Measurement System, Microwave T. Sep. 1988.

Automatic Testing & Networking Inc., NP4 Series Noise Parameter Test Set 0.05-26.5 GHZ, (sales brochure) Jun. 1988.

Automatic Testing & Networking, Inc., NP5 Series On-Wafer Noise Parameter & S-Parameter Test Set, 2-18 GHZ (sales brochure Jun. 1988).

Primary Examiner—Jack B. Harvey
Attorney, Agent, or Firm—Fliesler, Dubb, Meyer & Lovejoy

[57] ABSTRACT

Apparatus for measuring the noise parameters of a device under test (DUT), with full compensation for impedance mismatches between the DUT and the test apparatus. The apparatus includes an S-parameter measuring device, such as vector network analyzer (VNA), combined with a noise module. The noise module includes, among other things, a pair of test ports for the DUT, a noise source which can be turned on or off by an external controller, a receiver, and a switch for coupling the output of the DUT to selectably either the receiver or port 2 of the VNA.

28 Claims, 2 Drawing Sheets

MEASURING NOISE FIGURE AND Y-FACTOR

This application is a continuation of Ser. No. 07/502,825, filed Apr. 2, 1990, now abandoned.

BACKGROUND OF THE INVENTION

1. Field of the Invention

The invention is related to test instruments for electronic components, and more particularly, to test instruments for measuring noise parameters of an electronic component.

2. Description of the Related Art

For many purposes, it is desirable to have test equipment capable of accurately measuring the noise parameters of a device under test (DUT). The accuracy of such noise measurements is particularly important for components intended to operate at microwave frequencies, since lower-frequency components usually can meet noise specifications more easily. The smaller the uncertainty of the test instrument in measuring the noise parameters of a product, the better will be the manufacturer's worst-case noise specifications for the product.

The noise parameters of a component are usually specified in terms of noise factor F or equivalent noise temperature $T_e$. The noise factor of a device is defined as the ratio of the signal-to-noise ratio available from the device output to the signal-to-noise ratio delivered to the input of the device, at a standard reference temperature of $T_{Ref}=290°$ K. Noise factor is often expressed in dB, at which time it is sometimes referred to as a noise figure.

A well-known class of methods for measuring F involves applying two different noise signals with respective noise temperatures $T_C$ and $T_H$ to the input of the device, and measuring the noise power of the output in each case. For the input noise temperature of $T_C$, the measured output noise power is referred to herein as $N_1$. For the input noise temperature of $T_H$, the measured output noise power is referred to herein as $N_2$. The noise factor can be calculated from these numbers using the well-known formula, $$F = \frac{ENR - Y_m(T_C/T_{Ref} - 1)}{Y_M - 1},$$

where $$Y_m = N_2/N_1$$

and ENR is the "excess noise ratio" specified for the noise source when hot. ENR is given by $$ENR = (T_H/T_{Ref} - 1). \quad (eq. 1)$$

Other parameters may also be determined once $N_1$ and $N_2$ are known. For example, the equivalent noise temperature $T_e$ of the device is given by $$T_e = (T_H - Y_m T_C)/(Y_m - 1),$$

the gain G of the device can be derived from the formula:

$$G = (N_2 - N_1)/kB(T_H - T_C),$$

(where B is the bandwidth of the DUT or the test equipment, whichever is narrower, and k is Boltzmann's constant), the noise power $N_a$ added by the device is given by:

$$N_a = N_1 - GkT_CB,$$

and the noise figure in dB of the device is given by:

$$F(dB) = 10_{10}F.$$

In a practical noise parameter measurement system, the noise of the test equipment must be taken into account when measuring the noise of a DUT. A typical measurement model is shown in FIG. 1, in which a noise source 12 is coupled to the input port of a DUT 10, the output of which is coupled to the input port of a receiver 14. The noise source 12 is capable of supplying the two different noise temperatures, $T_H$ and $T_C$. In this setup, it is well known that the noise factor $F_{DUT}$ for the DUT can be calculated from the cascade formula:

$$F_{sys} = F_{DUT} + \frac{F_{rcvr} - 1}{G_{DUT}},$$

where $F_{rcvr}$ is the noise factor of the receiver, $F_{sys}$ is the noise factor of the entire system, and $G_{DUT}$ is the gain of the DUT. $F_{sys}$ can be determined by any of several known methods, including the 2-point technique described above. $F_{rcvr}$ may be determined using the same method, but with the DUT bypassed such that the noise source feeds directly into the receiver. Typically $F_{rcvr}$ is determined during a calibration step and stored in memory. $G_{DUT}$ can be calculated from the formula, $$G_{DUT} = \frac{(N_{2sys} - N_{1sys})/(T_{Hsys} - T_{Csys})}{(N_{2rcvr} - N_{1rcvr})/(T_{Hrcvr} - T_{Crcvr})},$$

where $N_{2sys}$ is the output noise power of the entire system, with the input noise at $T=T_{Hsys}$, $N_{1sys}$ is the output noise power of the entire system, with the input noise at $T=T_{Csys}$, $N_{2rcvr}$ is the output noise power of the receiver only, with input noise at $T=T_{Hrcvr}$, and $N_{1rcvr}$ is the output noise power of the receiver only, with the input noise set at $T=T_{Crcvr}$.

A simplification is possible if the noise source hot and cold temperatures $T_H$ and $T_C$ are assumed not to vary between the system noise measurements and the receiver noise measurements.

The cold noise temperature supplied to the system may be the noise temperature with the source turned off or discontented, and the hot noise temperature may be that applied when the noise source is turned on or connected. Noise sources are generally specified by the manufacturer in terms of their ENR at the hot temperature and $T_H$ can be calculated from equation (eq. 1) above. $T_C$ is usually assumed to be equivalent to the ambient temperature. The values of $T_C$ and either $T_H$ or ENR, possibly at various frequencies, are then typically entered into the system manually.

In the past, noise module measurement instruments were stand-alone and frequency-limited. They required additional frequency conversion hardware to perform noise measurements over a wide band. In addition, they could not measure S-parameters of the DUT, so that if a user wanted to measure both the S-parameters of a DUT and the noise parameters, two separate instruments were required.

S-parameters are typically measured using a vector network analyzer (VNA). Two examples of VNAs are the HP8510 manufactured by Hewlett-Packard Company, and the Wiltron 360, manufactured by Wiltron Company. A VNA is described in detail in U.S. patent application Ser. No. 07/176,202, filed Mar. 31, 1988 entitled "Microwave Measurement System and Associated Method," by Bradley, Grace, Thornton Finch, incorporated by reference herein.

The above formulas for calculating the noise parameters of a DUT all assume a perfect impedance match between the noise source and the DUT input port and between the DUT output port and the receiver input port. In the past, noise parameter measurement instruments have used the above formulas or their equivalents, and therefore required users either to use a DUT which has a perfect 50 ohm input and output impedance, or to insert isolators, circulators or carefully chosen attenuation pads at the input and output terminals of the DUT. The restriction to DUTs with perfect impedance inputs and outputs clearly limited the usefulness of the test instrument, but the insertion of isolators, circulators, or pads was cumbersome and often added its own noise. Additionally, the loss of any of these impedance correction components would directly increase the noise figure of the receiver and therefore add to the uncertainty for that reason alone. Isolators and circulators are less lossy than pads, but each is useful only within a limited frequency range. The impedance mismatch of the DUT is known to be one of the major sources of measurement uncertainty in prior-art noise module measurement systems. The issue is especially important at microwave frequencies, where mismatches are more common.

SUMMARY OF THE INVENTION

The above-described impedance mismatches can be taken into account by noting that in the definition of noise factor given above, the signal-to-noise ratio of the input signal refers to the ratio of signal-to-noise power available to the input of the DUT (i.e., delivered to the DUT), not the maximum available power supplied by the source. Similarly, the signal-to-noise ratio of the output signal of the DUT refers to the ratio of maximum available signal-to-noise power output by the DUT, not the ratio of signal-to-noise power actually delivered to the input of the receiver. Thus, instead of using the measured value of the Y factor in the above equations for F, a value $Y_{corrected}$ can be substituted. $Y_{corrected}$ is given by $$Y_{corrected} = Y_m \cdot U,$$

where $$U = \frac{|1 - |\Gamma_{srcC}|^2| \cdot |1 - \Gamma_{srcH}\Gamma_L|^2}{|1 - |\Gamma_{srcH}|^2| \cdot |1 - \Gamma_{srcC}\Gamma_L|^2}$$

where $\Gamma_{srcH}$ and $\Gamma_{srcC}$ are the reflection coefficient looking into the output port of the noise source when the source is at temperature $T_H$ and $T_C$, respectively, and $\Gamma_L$ is the reflection coefficient looking into the input port of whichever load (DUT or receiver) the source is coupled to. Additionally, the DUT gain used in the cascade formula above should be the insertion gain, rather than the available gain. The insertion gain Gins can be calculated from:

$$G_{ins} = \frac{|1 - \Gamma_S\Gamma_L|^2 |S_{21}|^2}{|1 - \Gamma_{IN}\Gamma_S|^2} \cdot \frac{1}{|1 - S_{22}\Gamma_L|^2},$$

where $\Gamma_S$ is the source reflection coefficient, $\Gamma_L$ is the reflection coefficient looking into the input of the receiver, $\Gamma_{IN}$ is the reflective coefficient looking into the input of the DUT with the output of the DUT connected to the receiver, and $S_{21}$ and $S_{22}$ are S-parameters of the DUT.

Use of the above formulas for correcting impedance mismatches is made possible by hardware which includes both an S-parameter measuring apparatus such as a VNA and also a noise module (NM). The noise module can either be manufactured as an optional add-on unit to the VNA, or can be included permanently within the VNA and selectable from the front panel. The noise module can include a pair of input ports either couplable to or permanently coupled to the test ports of the S-parameter measurement instrument, and further includes its own pair of test ports for coupling to a DUT. The input port of the noise module which corresponds to port 1 of the S-parameter measurement instrument can be coupled directly to test port 1 of the noise module, and a noise source can be included in the noise module which is either switchably coupled or directionally coupled to test port of the noise module. Noise module test port 2 can be coupled switchably to test port 2 of the S-parameter measurement instrument or to the input port of a receiver.

Thus, with the noise source off and test port 2 of the noise module connected to test port 2 of the S-parameter measurement instrument, the S-parameter measurement instrument can be calibrated at the noise module's test ports and can be used to measure the S-parameters of the DUT when connected to those ports. By connecting a through line across the two noise module test ports, the S-parameter measurement apparatus can also measure the S-parameters of the noise module. Then, with the through-lines still connected across the two noise module test parts, by switching test port 2 of the noise module to connect to the receiver instead of to test port 2 of the S-parameter measurement instrument, the noise contribution of the receiver can be calculated from a measurement of the noise power delivered to the receiver at hot and cold noise source temperatures. The noise contribution of the entire system can be calculated by measuring the noise power applied to the receiver for hot and cold noise source temperatures with the DUT in place, and the noise contribution of the DUT then can be calculated using the cascade equation. For both the receiver and system noise figures, the effects of impedance mismatch can be compensated for in the calculations through the use of the S-parameters which have previously been measured for the DUT and for the noise module.

BRIEF DESCRIPTION OF THE DRAWINGS

The invention will be described with respect to particular embodiments thereof, and reference will be made to the drawings, in which.

DETAILED DESCRIPTION

Figure 1:
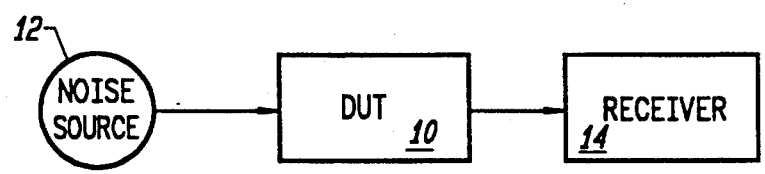
FIG. 1 shows a model for noise measurement calculations.
Figure 2:
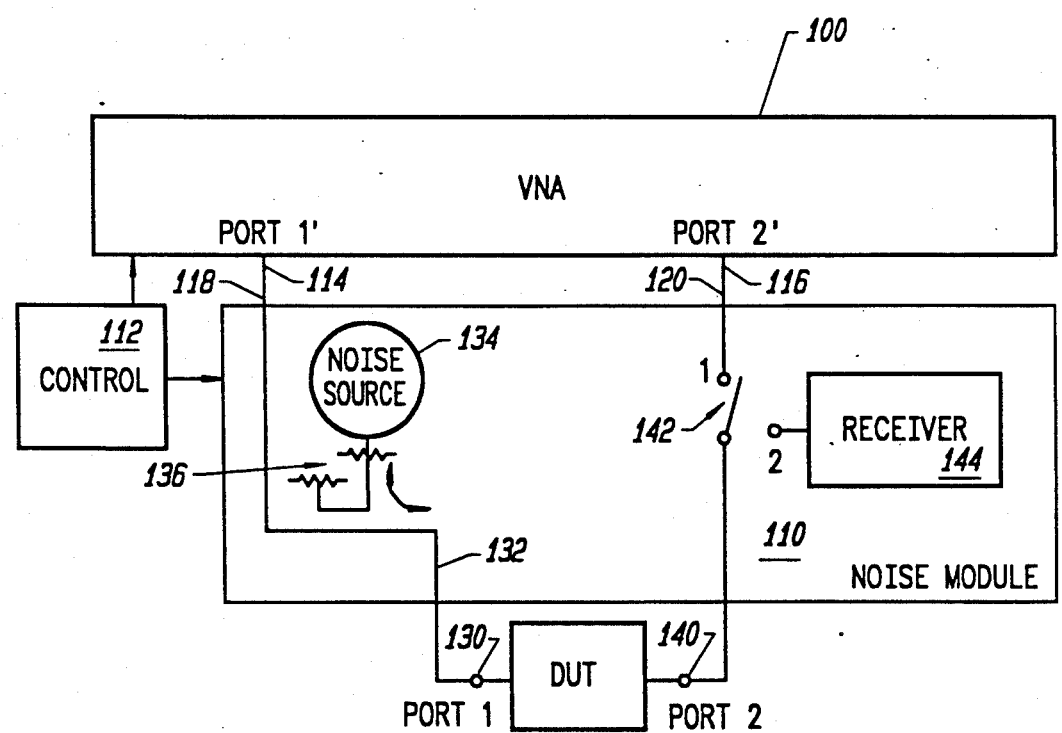
FIG. 2 is a block diagram of simplified apparatus according to the invention.

Shown in FIG. 2 is a block diagram of simplified apparatus according to the present invention. It comprises a VNA 100, which may be a Wiltron 360 VNA, a noise module 110, and an external controller 112. The VNA 100 has two test ports 114 and 116, referred to herein as secondary test ports. The secondary test ports 114 and 116 are coupled to respective input ports 118 and 120 of the noise module 110. Preferably the noise module 110 is constructed as a box with connectors on the input ports 118 and 120 which match the spacing of the secondary test ports 114 and 116, so that the noise module 110 can simply be attached to the front of the VNA 100 as an add-on module. Alternatively, the noise module 110 can be included inside the enclosure for the VNA 100, with its input ports 118 and 120 permanently connected to the secondary ports 114 and 116 of the VNA. In this case, the noise measurement functions of the combined system would be selectable from the front panel of the VNA 100.

All the control necessary for the VNA 100 to perform the noise measurements as described below may be entered on the front panel of the VNA 100. However, it is convenient to automate these functions through the use of the external controller 112, which may be an ordinary personal computer with a conventional bus interface for communicating with the VNA.

Inside the noise module 110, input port 118 is coupled to a primary test port 130 via a coaxial connection 132. A noise source 134 is coupled to the coaxial connection 132 via a directional coupler 136. A second primary test port 140 on the noise module 110 is coupled to the common port of a double-throw microwave switch 142, one pole of which is coupled to the second input port 120. The other pole of microwave switch 142 is coupled to the input port of a receiver 144 for measuring the power level delivered to it. The microwave switch 142 can be replaced by a directional coupler if desired, but a switch is preferred for its better isolation.

In operation, the user sets up the system by first entering the ambient temperature as the cold noise source temperature $T_C$ in the external controller. The hot noise temperature $T_H$ will be derived from the ENR of the noise source 134 either as specified by the manufacturer or as determined experimentally. Preferably, the maximum available ENR of the hot noise source 134 is measured at the factory prior to shipment of the system at 1 GHz frequency intervals with the output port of the noise source coupled to a receiver with a nearly perfect 50 ohm input impedance. The results of these measurements are stored in a file in the external controller 112.

After $T_C$ has been entered, the external controller 112 turns off the noise source 34 and switches the microwave switch 142 to position 1, thereby essentially coupling the primary ports 130 and 140 as extensions of the secondary ports 114 and 116 of the VNA 100. The user then runs the standard calibration sequence on the VNA 100, using the primary test ports 130 and 140 instead of the test ports of the VNA.

Once the initial calibration step is complete, the user connects a through-line across the two primary ports 130 and 140. The external controller 112 then instructs the VNA 100 to measure the reflection coefficieint $\Gamma_{SC}$ of the noise module 110, with the noise source off and the microwave switch 142 switched approximately.

The external controller 112 then turns on the noise source, and instructs the VNA 100 to measure the reflection coefficient $\Gamma_{SH}$ of the noise module 110 when it is on. As described in more detail below, the source reflection coefficients $\Gamma_{SC}$ and $\Gamma_{SH}$ looking into primary test port 130 of the noise module 110 can be calculated using the raw $S_{22}$ parameters as corrected using certain ones of the correction coefficients determined during the initial calibration step. Similarly, the reflection coefficient $\Gamma_L$, looking into the receiver 144, can be calculated from the raw value for $S_{11}$ and certain others of the error-correction terms determined during the initial calibration step. In particular, the following formulas are used to calculate the reflection coefficients $\Gamma_{SC}$, $\Gamma_{SH}$ and $\Gamma_L$:

$$\Gamma_{SH} = \frac{S_{22rH} - E_{dr}}{E_{sr}(S_{22rH} - E_{dr}) + E_{rr}}$$

$$\Gamma_{SC} = \frac{S_{22rC} - E_{dr}}{E_{sr}(S_{22rC} - E_{dr}) + E_{rr}}$$

$$\Gamma_L = \frac{S_{11r} - E_{df}}{E_{sf}(S_{11r} - E_{df}) + E_{rf}}$$

where
$S_{22rH}$ is the raw $S_{22}$ (noise source on)
$S_{22rC}$ is the raw $S_{22}$ (noise source off)
$S_{11r}$ is the raw $S_{11}$
$E_{sr}$ = Source Match Reverse
$E_{dr}$ = Directivity Error Reverse
$E_{rr}$ = Reflection Tracking Reverse
$E_{sf}$ = Source Match Forward
$E_{df}$ = Directivity Error Forward
$E_{rf}$ = Reflection Tracking Forward The error terms are defined in the above-identified "Microwave Measurement System and Associated Method" application, and in "Model 360 Vector Network Analyzer System Operation Manual," copyright date 1987, by Wiltron Company, also incorporated herein by reference.

With the through-line still connected and microwave switch 142 switched to pole 2 (coupling the primary test port 140 into the input of receiver 144), hot and cold noise measurements are then made by the receiver 144. The cold noise measurement $N_{1rcvr}$ is taken with the noise source 134 turned off, and the hot noise measurement $N_{2rcvr}$ is taken with the noise source 134 turned on. As previously explained, these values represent the noise power actually delivered to the input of receiver 144, which due to impedance mismatch may be different from the actual noise temperatures of the noise source 134. The corrected Y factor of the receiver 144 is then calculated by external controller 112 from the formula:

$$Y_{corrected} = Y_m \cdot \frac{|1 - |\Gamma_{SC}|^2| \cdot |1 - \Gamma_{SC}\Gamma_L|^2}{|1 - |\Gamma_{SH}|^2| \cdot |1 - \Gamma_{SH}\Gamma_L|^2}$$

where $Y_m$ is the measured Y factor of the receiver at the measurement frequency, given by $$Y_m = \frac{N_{2rcvr}}{N_{1rcvr}}.$$

The true noise factor of the receiver is then calculated from the formula:

$$F_{rcvr} = \frac{ENR_{avail} - Y_{corrected}\left(\dfrac{T_c}{290} - 1\right)}{Y_{corrected} - 1},$$

where $ENR_{avail}$ is the available noise power from the noise source, equal to kTB.

For the reasons set forth above, this calculated value for $F_{rcvr}$ already takes into account any impedance mismatch between the output of noise source 134 and the input of receiver 144, both when the noise source is on and when it is off.

Once the above steps have been completed, the system is fully calibrated and ready to measure the noise factor of various DUTs at the frequency(ies) at which it was calibrated. Accordingly, at this time the throughline is removed from the primary test ports 130 and 140, and a DUT is inserted in its place. The external controller 112 then switches microwave switch 142 to pole 1, turns off noise source 134 and instructs the VNA 100 to measure the four S-parameters of the DUT. The microwave switch 142 is then switched to pole 2, and the noise power $N_{1sys}$ and $N_{2sys}$ delivered to the receiver 144 is measured at the cold and hot noise temperatures $T_C$ and $T_H$ of noise source 134, respectively. The external controller 112 then calculates the corrected noise power ratio $Y'_{corrected}$ from the formula:

$$Y_{corrected} = \frac{|1 - |\Gamma_{SC}|^2| \cdot |(1 - S_{11}\Gamma_{SH})(1 - S_{22}\Gamma_L) - S_{12}S_{21}\Gamma_{SH}\Gamma_L|^2}{|1 - |\Gamma_{SH}|^2| \cdot |(1 - S_{11}\Gamma_{SC})(1 - S_{22}\Gamma_L) - S_{12}S_{21}\Gamma_{SC}\Gamma_L|^2} Y_m'$$

where $$Y_m' = \frac{N_{2sys}}{N_{1sys}}$$

is the measured Y factor for the combination of the DUT and the receiver.

The noise factor of the entire system is then calculated from the formula:

$$F_{sys} = \frac{ENR_{avail} - Y_{corrected}\left(\dfrac{T_c}{290} - 1\right)}{Y_{corrected} - 1}$$

and the insertion gain $G_{ins}$ of the DUT is calculated from the formula:

$$G_{ins} = \frac{|1 - \Gamma_S\Gamma_L|^2 |S_{21}|^2}{|1 - \Gamma_{IN}\Gamma_S|^2} \cdot \frac{1}{|1 - S_{22}\Gamma_L|^2},$$

The external controller 112 finally calculates the noise factor of the DUT alone from the equation:

$$F_{DUT} = F_{sys} - \frac{F_{rcvr} - 1}{G_{ins}}$$

and displays the results. Accordingly, it can be seen that the noise module 110, in combination with the VNA 100 and external controller 112, can determine the noise factor of an arbitrary DUT as if measured on a perfectly matched system, without the need for a perfect impedance match as required by prior-art systems.

Figure 3:
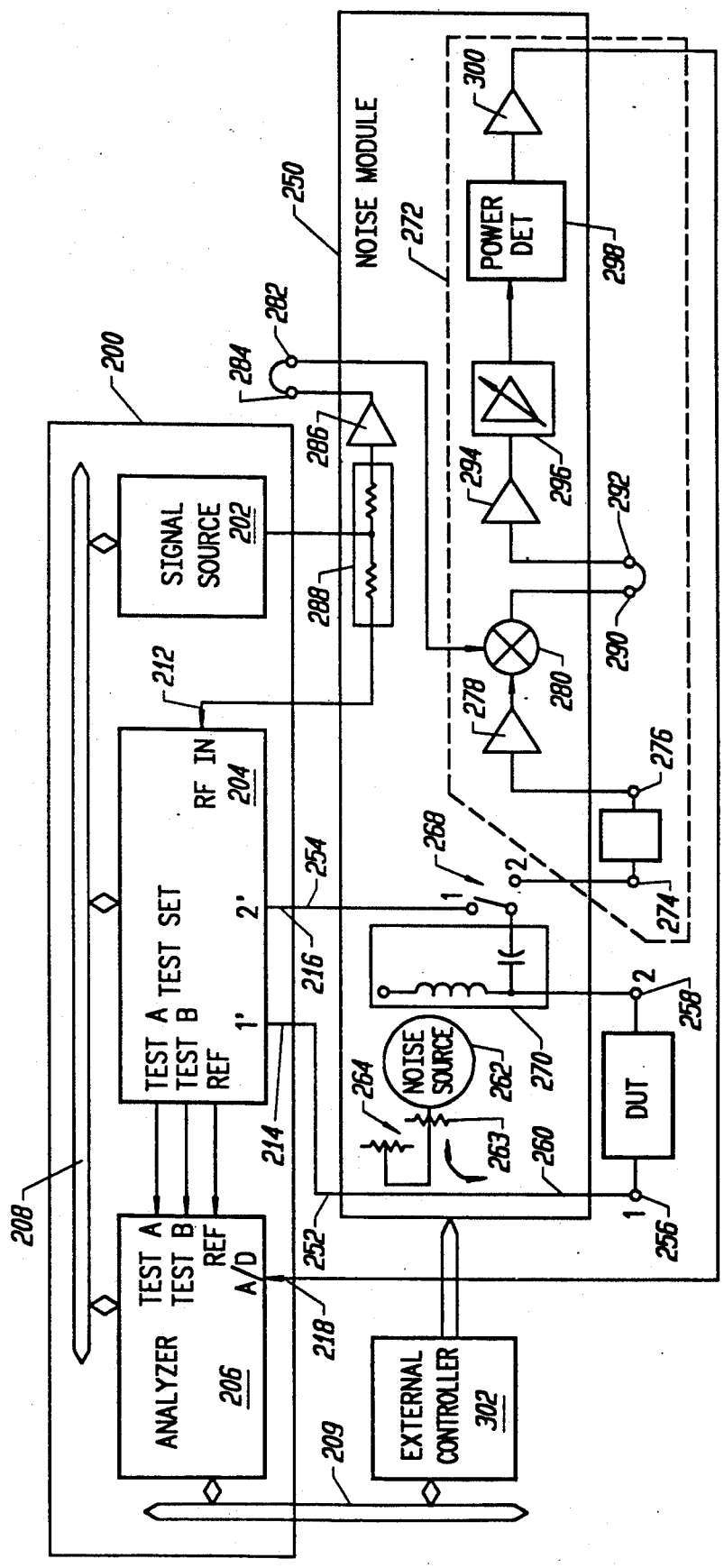
FIG. 3 is another block diagram of apparatus according to the invention.

In FIG. 3 there is shown a more detailed diagram of apparatus according to the invention. It comprises a VNA 200, having a programmable signal source 202, a test set 204 and an analyzer 206, all interconnected over an internal GPIB bus 208. The signal source 202 can perform a large number of functions, including generating an extremely pure sinewave of specified frequencies within the microwave band. It can also be programmed via the bus 208 with parameters for a swept frequency output and can be stepped from one frequency to the next in response to signals on the bus 208.

The test set 204 includes an RF input 212 which, for normal VNA applications, would normally be connected to the output of the signal source 202. The test set 204 also has first and second secondary test ports 214 and 216, to which a DUT would normally be connected. The test set 204 further has a Test A output, a Test B output, and a Reference output, all of which are connected to respective inputs of the analyzer 206. The RF input signal to the test set 204 is coupled to the Reference output signal, and also to selectably test port 214 or 216. The Test A output is coupled from test port 214, and the Test B output is coupled from test port 216. Thus, when the test set is switched to couple the RF input signal to test port 214, the Test A signal represents the reflected signal while the Test B signal represents the signal after it has passed through whatever DUT is connected between ports 214 and 216. Similarly, if the test set is switched to couple the RF input signal to test port 216, the Test B signal represents the reflected signal from test port 216, and the Test A signal represents the signal after it has passed through whatever is connected between test ports 214 and 216.

The analyzer 206 controls the switch in the test set 204 via the bus 208, for specifying whether the RF input to the test set 204 is to be applied to test port 214 or 216. The analyzer 206 receives the Test A, Test B and Reference signals, and by comparing them and knowing the state of the switch in the test set, can determine the four S-parameters for the frequency of the RF input signal supplied by the signal source 202, of whatever is coupled between ports 214 and 216. The analyzer 206 also includes as part of its hardware an analog-to-digital converter and an auxiliary A/D input 218, such that an external device can make use of the A/D hardware within the analyzer 206.

In the system of FIG. 3, a noise module 250 is also included, which has first and second input ports 252 and 254 and first and second primary test ports 256 and 258, respectively. As with the system of FIG. 2, the input ports 252 and 254 of the noise module 250 are coupled to the secondary test ports 214 and 216, respectively, and input port 252 is coupled to primary test port 256 via a coaxial connection 260. A noise source 262 is coupled to the coaxial connection 260 via a 3 dB pad 263 and a directional coupler 264 (A switch may be used in place of the coupler 264). The primary test port 258 is coupled to a common of a microwave switch 268, as in the system of FIG. 2, but a DC bias device 270 has been inserted between the DUT and the switch 268. No DC bias device is needed on the port 1 side of the DUT, since appropriate circuitry is already included in the test set 204. Like the system of FIG. 2, pole 1 of the microwave switch 268 is coupled to the input port 254 of the noise module 250, and pole 2 is coupled to the input of a receiver 272.

Inside the receiver 272, the input signal is brought out to an external port 274 and back into the noise module 250 via another external port 276. The user can either couple a through-line across these ports, or can insert an optional external preamp and tracking YIG filter if single sideband measurements are desired. If an external preamp and YIG filter are used, they are left in place for the entire operation of the system, including the calibration steps.

Port 276 is connected through an RF amplifier 278 to the RF input of a mixer 280. The LO input of the mixer 280 is also coupled to an external port 282 for the reasons explained below. Typically, the user will couple port 282 to another external port 284 with a through-line. External port 284 is connected to the output of an IF amplifier 286, the input of which is connected to one output of a power splitter 288. The input of power splitter 288 is coupled to the output of signal source 202, and the other output of power splitter 288 is connected to the RF input 212 of the test set 204. In this way, the same set of frequencies at which the VNA 200 measures the S-parameters of the noise module 250 and of the DUT can be used to measure $N_1$ and $N_2$.

The IF output port of the mixer 280 in the receiver 272 is coupled via another pair of externally accessible ports 290 and 292 to the input of an IF amplifier 294, the output of which is coupled to the input of a gain-ranging IF amplifier 296, the output of which is coupled to the input of a power detector 298. The analog output of power detector 298 is coupled via a DC amplifier 300 to the A/C input 218 of analyzer 206. External ports 290 and 292 are usually coupled together with a through-line. The ports 274/276, 282/284 and 290/292 are provided externally so that, by opening up the coupling between them, the user may supply his own RF amplifier and mixer. This enables the user to substitute lower noise components, if desired, or to test the noise parameters of frequency converting devices such as mixers.

An external controller 302 is also included in the system of FIG. 3. The external controller 302 issues commands to the VNA 200 over an external GPIB bus 209. It can also retrieve the S-parameters determined by the analyzer 206, and can retrieve the calibration error terms which the analyzer has determined during calibration step as well. The external controller 302 also controls the microwave switch 268 in the noise module 250 and turns on or off the noise source 262.

The operation of the system of FIG. 3 is similar to that of FIG. 2, the only major difference being that during the setup step, in addition to entering the ambient temperature $T_C$, the user also specifies whether the measurement is to be single or double sideband and specifies the frequency stepping parameters desired. The calibration steps, with the through-line coupled between the two primary test ports 256 and 258, are then performed for all the desired frequencies and the results stored in the external controller 302. The DUT is then inserted between the primary test ports 256 and 258, and the S-parameters and noise factors of the DUT are calculated for all the same frequencies.

Noise source 262 can be a standard off-the-shelf noise source, but should have high ENR (greater than about 15 dB) in order to be useful to test very noisy DUTs. A model NC4131 noise source, manufactured by Noisecom, Paramus, N.J., is acceptable. The directional coupler 264 may similarly be a standard 6 dB coupler such as model No. 4203-6 made by Narda Microwave Corp., Hauppauge, N.Y. At lower frequencies, the directional coupler 264 could also be replaced with a switch The microwave switch 268 is also an off-the-shelf component, and preferably has good VSWR (about 1.3) up to at least 20 GHz. An example of a standard relay which can be used for microwave switch 268 is the model 401-83 made by Dow-Key, or an HP33311C. The RF amplifier 278 may be a standard 2–20 GHz MMIC amplifier, and the mixer 280 may be a model DBL2-26 made by RHG, Deer Park, N.Y. The IF amplifier 294 should have a very low noise figure, on the order of about 2 dB, such as a 20 dB amplifier model No. PSA-J834M made by Penstock. The gain-ranging amplifier 296 is variable between 10 and 70 dB, and is controlled by the external controller 302 in order to bring its output into the power range at which power detector 298 is most accurate. The gain eventually chosen for this amplifier for any particular measurement is subsequently compensated for in the calculations. Though not shown in FIG. 3, the gain-ranging amplifier 296 is both preceded and followed by a narrow-band tuned circuit in order to minimize the frequency bandwidth within which the noise figure of a DUT is being measured. This improves the measurement accuracy if the noise figure of the DUT varies significantly with frequency.

The invention has been described with respect to particular embodiments thereof, and it will be understood that numerous variations are possible without departing from the scope of the invention.

What is claimed is:

1. A noise measurement system for determining the noise factor of a DUT having first and second ports, comprising:
   first and second primary test ports for coupling to respectively said first and second ports of said DUT;
   a noise source having a port and operable at selectably a first or a second temperature $T_C$ or $T_H$;
   a power detector having an input port;
   termination characterization apparatus having first and second secondary test ports;
   means for coupling said first primary test port to said first secondary test port and selectably to said port of said noise source;
   means for coupling said second primary test port to said second secondary test port and selectably to said port of said power detector; and
   control means for controlling said termination characterization apparatus to:
   measure first and second source terminations looking into said port of said noise source operating at respectively $T_C$ and $T_H$, with said first primary test port coupled to said port of said noise source, said second primary test port coupled to said second secondary test port and said first primary test port coupled to said second primary test port,
   measure a first load termination looking into said first port of said DUT, with said first primary test port coupled to said first secondary test port and to said first port of said DUT, said second primary test port coupled to said second port of said DUT and to said port of said power detector, and
   measure first and second noise power levels $N_1$ and $N_2$ delivered to said power detector, with said first primary test port coupled to said port of said noise source and to said first port of said DUT and said second primary test port coupled to said port of said power detector and to said second port of said DUT, and with said noise source operating at $T_C$ and $T_H$ respectively; and means for calculating a value for said noise factor of said DUT as a function of $N_1$, $N_2$, $T_C$, $T_H$, said measured first and second source terminations, and said measured first load termination.

2. A system according to claim 1, wherein said means for calculating said value for said noise factor comprises means for calculating said value from the formula $$F = \frac{ENR_{avail} - Y_{corrected}(T_C/290 - 1)}{Y_{corrected} - 1},$$

where $ENR_{avail} = (T_H/290 - 1)$, $Y_{corrected} = Y_m \cdot U$ $Y_m = N_2/N_1$, and U is a factor which corrects $Y_m$ for any impedance mismatch between said port of said noise source and said first port of said DUT.

3. A system according to claim 1, wherein said termination characterization apparatus includes an analog-to-digital converter having an input couplable to receive signals selectably from said first or second secondary test port and said output of said analog-to-digital converter, wherein said power detector comprises means for providing an analog signal indicative of the power level of a signal applied to said port of said power detector, and wherein said system further comprises means for coupling said analog signal to said input of said analog-to-digital converter.

4. A system according to claim 1, wherein said first and second primary test ports are permanently coupled to said first and second secondary test ports.

5. A system according to claim 1, wherein said first and second primary test ports are removably coupled to said first and second secondary test ports.

6. A system according to claim 1, wherein said means for coupling said first primary test port comprises means for coupling said first primary test port to said first secondary test port and additionally to said port of said noise source.

7. A system according to claim 1, wherein said means for coupling said second primary test port comprises:
a switch having a common and first and second switch ports, said common being coupled to said second primary test port;
first coupling means for coupling said first switch port to said second secondary test port; and
second coupling means for coupling said second switch port to said port of said power detector.

8. A system according to claim 7, wherein said second coupling means comprises hetrodyne means for hetrodyning an RF signal coupled from said second switch port to an IF signal coupled to said port of said power detector.

9. A system according to claim 8, wherein said second coupling means further comprises means for coupling external components between said second switch port and said hetrodyne means.

10. A system according to claim 8, wherein said second coupling means further comprises means for bypassing said hetrodyne means with external components.

11. A system according to claim 8, wherein said 4-pole characterization apparatus includes a local oscillator and said hetrodyne means has an LO input port, further comprising means for coupling said local oscillator to said LO input port of said hetrodyne means.

12. A noise measurement system for determining the noise factor of a DUT having first and second ports, comprising:
first and second primary test ports for coupling to respectively said first and second ports of said DUT;
a noise source having a port and operable at selectably a first or a second temperature $T_C$ or $T_H$;
a power detector having an input port;
4-pole characterization apparatus having first and second secondary test ports;
means for coupling said first primary test port to said first secondary test port and selectably to said port of said noise source;
means for coupling said second primary test port to said second secondary test port and selectably to said port of said power detector; and
control means for controlling said 4-pole characterization apparatus to:
measure first and second source terminations looking into said port of said noise source operating at respectively $T_C$ and $T_H$, with said first primary test port coupled to said port of said noise source, said second primary test port coupled to said second secondary test port and said first primary test port coupled to said second primary test port,
measure a first load termination looking into said first port of said DUT, with said first primary test port coupled to said first secondary test port and to said first port of said DUT, said second primary test port coupled to said second port of said DUT and to said port of said power detector,
measure a second load termination looking into said port of said power detector, with said first primary test port coupled to said first secondary test port, said second primary test port coupled to said port of said power detector and said first primary test port coupled to said second primary test port,
measure 4-pole parameters of said DUT, with said first primary test port coupled to said first secondary test port and to said first port of said DUT and said second primary test port coupled to said second secondary test port and to said second port of said DUT,
measure first and second noise power levels $N_1$ and $N_2$ delivered to said power detector, with said first primary test port coupled to said port of said noise source and to said first port of said DUT and said second primary test port coupled to said port of said power detector and to said second port of said DUT, and with said noise source operating at $T_C$ and $T_H$ respectively, and
measure third and fourth noise power levels $N_3$ and $N_4$ delivered to said power detector, with said first primary test port coupled to said port of said noise source, said second primary test port coupled to said port of said power detector and said first primary test port coupled to said second primary test port, and with said noise source operating at $T_C$ and $T_H$ respectively; and means for calculating a value for said noise factor of said DUT as a function of $N_1$, $N_2$, $N_3$, $N_4$, $T_C$, $T_H$, said measured first and second source terminations, said measured first and second load terminations, and said measured 4-pole parameters of said DUT.

13. A system according to claim 12, wherein said means for calculating said value for said noise factor of said DUT comprises means for calculating said value from the formula $$F_{DUT} = F_{sys} - \frac{F_{rcvr} - 1}{G_{ins}},$$

where $$F_{sys} = \frac{ENR_{avail} - Y'_{corrected}(T_C/290 - 1)}{Y'_{corrected} - 1},$$

$$ENR_{avail} = (T_H/290 - 1),$$

$$Y'_{corrected} = \frac{|1 - |\Gamma_{SC}|^2| \cdot |(1 - S_{11}\Gamma_{SH})(1 - S_{22}\Gamma_{rcvr}) - S_{12}S_{21}\Gamma_{SH}\Gamma_{rcvr}|^2}{|1 - |\Gamma_{SH}|^2| \cdot |(1 - S_{11}\Gamma_{SC})(1 - S_{22}\Gamma_{rcvr}) - S_{12}S_{21}\Gamma_{SC}\Gamma_{rcvr}|^2} Y_m'$$

$$Y_m = N_2/N_1,$$

$\Gamma_{SC}$ is the reflection coefficient of said measured first source termination looking into the port of said noise source with said noise source operating at said first temperature $T_C$, $\Gamma_{SH}$ is the reflection coefficient of said measured first source termination looking into the port of said noise source with said noise source operating at said second source temperature $T_H$, $\Gamma_{rcvr}$ is the reflection coefficient of said measured second load termination looking into the port of said power detector, $S_{11}$, $S_{12}$, $S_{21}$ and $S_{22}$ are the S-parameters of said measured 4-pole parameters of said DUT, $G_{ins}$ is the insertion gain of said DUT, $$F_{rcvr} = \frac{ENR_{avail} - Y_{corrected}(T_C/290 - 1)}{Y_{corrected}},$$

$$Y_{corrected} = Y_m \cdot u$$

and $$Y_m = N_4/N_3.$$

14. Apparatus according to claim 13, wherein said means for calculating further comprises means for calculating a value for the insertion gain $G_{ins}$ of said DUT according to the formula $$G_{ins} = \frac{|1 - \Gamma_{SC}\Gamma_{rcvr}|^2 \, |S_{21}|^2}{|1 - \Gamma_{IN}\Gamma_S|^2} \cdot \frac{1}{|1 - S_{22}\Gamma_{rcvr}|^2},$$

where $\Gamma_S$ is the source reflection coefficient and $\Gamma_{IN}$ is the reflection coefficient of said measured first load termination looking into the first port of said DUT, said second port of said DUT being coupled to said port of said power detector.

15. A method for determining the noise factor $F_{load}$ at a given frequency of a load which includes a receiver, comprising the steps of:

measuring a first source termination looking into the port of a noise source;

measuring a first load termination looking into the input of said load;

measuring a first noise power level $N_1$ delivered to said receiver with said noise source port coupled to said load input and operating at a first temperature $T_C$;

measuring a second noise power level $N_2$ delivered to said receiver with said noise source port coupled to said load input and operating at a second temperature $T_H$; and calculating a value for $F_{load}$ using said measured noise power levels $N_1$ and $N_2$, as corrected for mismatch using said measured first source termination and said measured load termination.

16. A method according to claim 15, wherein said step of measuring a first source termination comprises the steps of:

using a signal source to generate a test signal at said given frequency;

applying said test signal to the port of said noise source; and observing the signal reflected from said port of said noise source, and wherein said step of measuring a first noise power level $N_1$ comprises the steps of:

mixing said same test signal with said noise source output as delivered to said receiver; and measuring said noise power level $N_1$ at an intermediate frequency.

17. A method according to claim 15, wherein said step of measuring a first source termination comprises the steps of:

using a signal source to generate a test signal at said given frequency;

applying said test signal to the port of said noise source; and observing the signal reflected from said port of said noise source, wherein said step of measuring a first load termination comprises the steps of:

applying said test signal to the input of said load; and observing the signal reflected from the input of said load, wherein said step of measuring a first noise power level $N_1$ comprises the steps of:

mixing said same test signal with said noise source output as delivered to said receiver with said noise source operating at said first temperature $T_C$; and measuring said noise power level $N_1$ at an intermediate frequency, and wherein said step of measuring a second noise power level $N_2$ comprises the steps of:

mixing said same test signal with said noise source output as delivered to said receiver with said noise source operating at said second temperature $T_H$; and measuring said noise power level $N_2$ at said intermediate frequency.

18. A method according to claim 15, wherein said load comprises a DUT and said receiver, said input of said load being a first port of said DUT and said DUT further having a second port coupled to an input of said receiver, further for determining the noise factor $F_{DUT}$ of said DUT, and further comprising the steps of:
- measuring a second load termination looking into the input of said receiver with said DUT disconnected;
- measuring third and fourth noise power levels $N_3$ and $N_4$ delivered to said receiver with said noise source port coupled to said receiver input and operating at respectively said first and second temperatures $T_C$ and $T_H$; and
- calculating a value for $F_{DUT}$ from the equation $$F_{DUT} = F_{load} - \frac{F_{rcvr} - 1}{G_{ins}}$$

where $F_{rcvr}$ is a value for the noise factor of said receiver determined using said measured noise power levels $N_3$ and $N_4$ and corrected for mismatch using said measured first source termination and said measured second load termination, and $G_{ins}$ is the insertion gain of said DUT.

19. A method according to claim 18, further comprising the step of calculating $F_{rcvr}$ prior to said step of calculating a value for $F_{DUT}$.

20. A method according to claim 18, further comprising the steps of:
- determining values for S-parameters $S_{21}$ and $S_{22}$ of said DUT; and calculating $G_{ins}$ from the formula $$G_{ins} = \frac{|1 - \Gamma_S \Gamma_{rcvr}|^2 \, |S_{21}|^2}{|1 - \Gamma_{load} \Gamma_S|^2} \cdot \frac{1}{|1 - S_{22} \Gamma_{rcvr}|^2},$$

where
$\Gamma_S$ is the reflection coefficient of said measured first source termination looking into the port of said noise source operating at said first temperature $T_C$;
$\Gamma_{rcvr}$ is the reflection coefficient of said measured second load termination looking into the input of said receiver with said DUT disconnected; and
$\Gamma_{load}$ is the reflection coefficient of said measured first load termination looking into the input of said DUT.

21. A method according to claim 15, wherein said step of measuring a first source termination looking into the port of a noise source is performed while said noise source is operating at said temperature $T_H$.

22. A method according to claim 15, further comprising the step of measuring a second source termination looking into the port of said noise source operating at said second temperature $T_H$, said step of measuring a first source termination being performed while said noise source is operating at said first temperature $T_C$, and wherein said step of calculating a value for $F_{load}$ corrects for mismatch by further using said measured second source termination.

23. A method according to claim 22, wherein said step of calculating a value for $F_{load}$ calculates said value from the formula $$F_{load} = \frac{ENR_{avail} - Y_{corrected}(T_C/290 - 1)}{Y_{corrected} - 1},$$

where $ENR_{avail} = (T_H/290 - 1)$, $Y_{corrected} = Y_m \cdot U$ $Y_m = N_2/N_1$, and
U is a factor which corrects $Y_m$ for any impedance mismatch between said port of said noise source and said input of said load.

24. A method according to claim 15, wherein said step of measuring a first source termination comprises the step of measuring the reflection coefficient $\Gamma_S$ of said first source termination.

25. A method according to claim 15, wherein said step of measuring a first source termination comprises the steps of:
- applying a test signal to the port of said noise source;
- applying the signal reflected from said port of said noise source to the analog input of an analog-to-digital converter; and
- analyzing the digital output of said analog-to-digital converter, and wherein said step of measuring a first noise power level $N_1$ comprises the steps of:
- mixing said noise source output as delivered to said receiver down to an intermediate frequency, said noise source operating at said first temperature $T_C$;
- producing a first analog signal indicative of the power level delivered to a power detector;
- applying said first analog signal to said analog input of said same analog-to-digital converter; and
- analyzing the digital output of said analog-to-digital converter.

26. A method according to claim 15, wherein said step of measuring a first source termination comprises the steps of:
- applying a test signal to the port of said noise source;
- applying the signal reflected from said port of said noise source to the analog input of an analog-to-digital converter; and
- analyzing the digital output of said analog-to-digital converter;

wherein said step of measuring a first load termination comprises the steps of:
- applying said test signal to the input of said load;
- applying the signal reflected from said input of said load to said analog input of said analog-to-digital converter; and
- analyzing the digital output of said analog-to-digital converter, wherein said step of measuring a first noise power level $N_1$ comprises the steps of:
- mixing said noise source output as delivered to said receiver down to an intermediate frequency, said noise source operating at said first temperature $T_C$;
- producing a first analog signal indicative of the power level delivered to a power detector;
- applying said first analog signal to said analog input of said same analog-to-digital converter; and
- analyzing the digital output of said analog-to-digital converter and wherein said step of measuring a second noise power level $N_2$ comprises the steps of:
- mixing said noise source output as delivered to said receiver down to an intermediate frequency, said noise source operating at said second temperature $T_H$;
- producing a second analog signal indicative of the power level delivered to said power detector;
- applying said second analog signal to said analog input of said same analog-to-digital converter; and
- analyzing the digital output of said analog-to-digital converter.

27. A method for determining the noise factor $F_{DUT}$ of a DUT, comprising the steps of:
   measuring first and second source terminations looking into the port of a noise source operating at respectively first and second temperatures $T_C$ and $T_H$;
   measuring a receiver termination looking into the port of a receiver;
   measuring a first load termination looking into a first port of said DUT, a second port of said DUT being coupled to the port of said receiver;
   measuring 4-pole parameters of said DUT;
   measuring first and second noise power levels $N_1$ and $N_2$ delivered to said receiver, with said DUT coupled between said port of said noise source and said port of said receiver, said noise source operating at respectively said first and second temperatures;
   measuring third and fourth noise power levels $N_3$ and $N_4$ delivered to said receiver, with said port of said noise source coupled by a through-line to said port of said receiver, said noise source operating at respectively said first and second temperatures; and
   calculating a value for $F_{DUT}$ as a function of $N_1$, $N_2$, $N_3$, $N_4$, $T_C$, $T_H$, said measured first and second source terminations, said measured first load termination, said measured receiver termination, and said measured 4-pole parameters of said DUT.

28. A method according to claim 27, wherein said step of calculating comprises the step of calculating said value for $F_{DUT}$ from the formula $$F_{DUT} = F_{sys} - \frac{F_{rcvr} - 1}{G_{ins}},$$

where $$F_{sys} = \frac{ENR_{avail} - Y'_{corrected}(T_C/290 - 1)}{Y'_{corrected} - 1},$$

$$ENR_{avail} = (T_H/290 - 1),$$

$$Y'_{corrected} = \frac{|1 - |\Gamma_{SC}|^2| \cdot |(1 - S_{11}\Gamma_{SH})(1 - S_{22}\Gamma_{rcvr}) - S_{12}S_{21}\Gamma_{SH}\Gamma_{rcvr}|^2}{|1 - |\Gamma_{SH}|^2| \cdot |(1 - S_{11}\Gamma_{SC})(1 - S_{22}\Gamma_{rcvr}) - S_{12}S_{21}\Gamma_{SC}\Gamma_{rcvr}|^2} Y'_m$$

$$Y'_m = N_2/N_1,$$

$\Gamma_S$ is the reflection coefficient of said measured first source termination looking into the port of said noise source with said noise source operating at said first temperature $T_C$, $\Gamma_{SH}$ is the reflection coefficient of said measured first source termination looking into the port of said noise source with said noise source operating at said second source temperature $T_H$, $\Gamma_{rcvr}$ is the reflection coefficient of said measured receiver termination looking into the port of said receiver, $S_{11}$, $S_{12}$, $S_{21}$ and $S_{22}$ are the S-parameters of said measured 4-pole parameters of said DUT, $$G_{ins} = \frac{|1 - \Gamma_S\Gamma_{rcvr}|^2 |S_{21}|^2}{|1 - \Gamma_{IN}\Gamma_S|^2} \cdot \frac{1}{|1 - S_{22}\Gamma_{rcvr}|^2},$$

$\Gamma_S$ is the source reflection coefficient and
$\Gamma_{IN}$ is the reflection coefficient of said measured first load termination looking into the first port of said DUT, said second port of said DUT being coupled to said port of said receiver, $$F_{rcvr} = \frac{ENR_{avail} - Y_{corrected}(T_C/290 - 1)}{Y_{corrected}},$$

$$Y_{corrected} = Y_m \cdot \frac{|1 - |\Gamma_{SC}|^2| \cdot |1 - \Gamma_{SC}\Gamma_{rcvr}|^2}{|1 - |\Gamma_{SH}|^2| \cdot |1 - \Gamma_{SH}\Gamma_{rcvr}|^2},$$

and $$Y_m = N_4/N_3.$$

* * * * *

UNITED STATES PATENT AND TRADEMARK OFFICE
CERTIFICATE OF CORRECTION

PATENT NO. : 5,191,294
DATED : March 2, 1993
INVENTOR(S) : Grace, et al.

It is certified that error appears in the above-identified patent and that said Letters Patent is hereby corrected as shown below:

Col. 13, line 54, after "$N_4/N_3$", insert --and U is a factor which corrects $Y_m$ for any impedance mismatch between said port of said noise source and said port of said power detector.--

Col. 13, in the equation at line 61, change "$\Gamma_{sc}$" to --$\Gamma_s$--.

Col. 18, line 11, change "$\Gamma_s$" to --$\Gamma_{sc}$--.

Signed and Sealed this

Twenty-eighth Day of December, 1993

Attest:

BRUCE LEHMAN

*Attesting Officer*  *Commissioner of Patents and Trademarks*